United States Patent [19]

Yoshizawa et al.

[11] Patent Number: 4,700,129
[45] Date of Patent: Oct. 13, 1987

[54] PHASE MEASUREMENT APPARATUS WITH AUTOMATIC CALIBRATION

[75] Inventors: Shigemichi Yoshizawa, Kanagawa; Goro Saito, Atsugi, both of Japan

[73] Assignee: Anritsu Corporation, Tokyo, Japan

[21] Appl. No.: 899,952

[22] Filed: Aug. 25, 1986

[30] Foreign Application Priority Data

Aug. 30, 1985 [JP] Japan .......................... 60-132633[U]

[51] Int. Cl.[4] ........................................... G01R 25/00
[52] U.S. Cl. ................................ 324/83 R; 324/83 D; 324/74
[58] Field of Search ..................... 375/22; 340/674; 324/83 D, 83 R, 77 R, 77 B, 83 A, 83 FE, 83 FM, 85, 74, 78 Z, 77 D; 370/100; 371/34; 307/592, 597; 328/133, 134, 139

[56] References Cited

U.S. PATENT DOCUMENTS

| | | | |
|---|---|---|---|
| 4,327,441 | 4/1982 | Bradshaw | 375/22 |
| 4,420,747 | 12/1983 | Kistner | 340/674 |
| 4,578,705 | 3/1986 | Elmis et al. | 324/83 D |
| 4,634,967 | 1/1987 | Virieux et al. | 324/83 D |
| 4,636,719 | 1/1987 | Zuk et al. | 324/83 D |

*Primary Examiner*—Michael J. Tokar
*Attorney, Agent, or Firm*—Frishauf, Holtz, Goodman & Woodward

[57] ABSTRACT

In a phase measurement apparatus having a phase detector for receiving a first frequency signal from a variable frequency signal generator and a second frequency signal from the generator through a calibration member having good linear frequency vs. phase characteristics and for detecting the input signals and outputting a phase difference signal, the apparatus further includes a first phase ratio operation section for changing an output frequency of the generator, receiving phase difference signals at frequencies as integer multiples of a phase difference of 2, and calculating a first frequency vs. phase difference ratio for the calibration member a second phase ratio operation section for changing the output frequency of the generator in a relatively narrow frequency range, receiving phase difference signals at upper and lower limit frequencies of the frequency range, and calculating a second frequency vs. phase difference ratio and a calibration section for comparing the first and second frequencies vs. phase difference ratios, increasing the gain of a variable gain amplifier for amplifying the phase difference signal when the second frequency vs. phase difference ratio is smaller than the first frequency vs. phase difference ratio, and decreasing the gain of the variable gain amplifier when the second frequency vs. phase difference ratio is larger than the first frequency vs. phase difference ratio.

4 Claims, 9 Drawing Figures

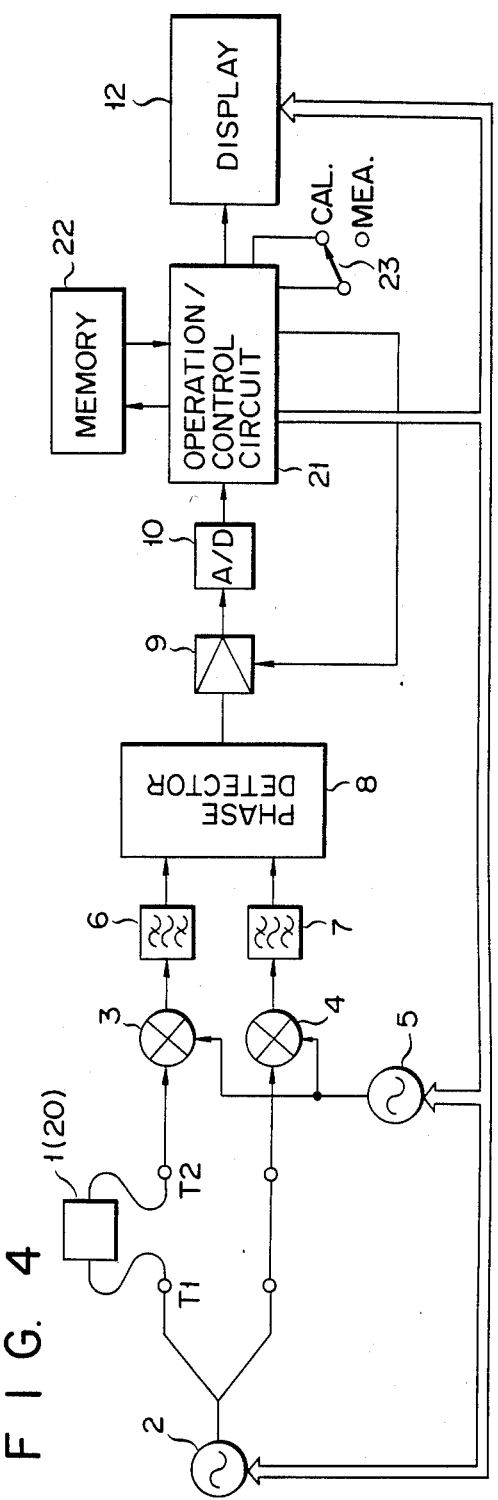
F I G. 4

PHASE MEASUREMENT APPARATUS WITH AUTOMATIC CALIBRATION

BACKGROUND OF THE INVENTION

This invention relates to a phase measurement apparatus with automatic calibration, and more particularly, to a phase measurement apparatus for measuring the phase difference between optical signals and electrical signals derived from electric waves and the phase characteristics of an object to be measured.

A typical conventional phase measurement apparatus is illustrated in FIG. 1. Referring to FIG. 1, reference numeral 1 denotes an object to be measured. An output signal from variable frequency signal generator 2 is applied to object 1, and the frequency signal passed through object 1 is supplied to mixer 3. The output signal from generator 2 is directly supplied to mixer 4. Mixers 3 and 4 mix a local frequency signal from local oscillator 5 with the output signals supplied through object 1 and directly from generator 2, and generate low-frequency signals. These low-frequency signals are filtered through filters 6 and 7, respectively. The filtered signals are supplied as IF (Intermediate Frequency) signals to phase detector 8. Detector 8 calculates a difference between these IF signals and generates a phase difference signal. The phase difference signal is amplified by variable gain amplifier 9 and the amplified signal is converted by A/D (Analog/Digital) converter 10 to a digital signal. The digital signal is then displayed on display 12. In other words, the phase difference caused by object 1, that is, the phase characteristics of the object, is displayed. It should be noted that frequency setter 11 sets frequencies required for control of generator 2 and oscillator 5, and display 12.

Since the gain (output gain) of phase detector 8 varies particularly in the phase measurement apparatus due to changes in ambient conditions such as changes in temperatures, calibration is performed to correct such variations. In a conventional phase measurement apparatus, two calibration methods (i) and (ii) are selectively used:

(i) The phase measurement apparatus is connected to a reference phase setter in place of object 1. The phase characteristics of the phase setter under predetermined ambient conditions are already known. The output frequency of variable frequency signal generator 2 is changed by frequency setter 11 within any relatively narrow frequency band of f1 to f2 ($=\Delta f1$). Variation $\Delta\phi 1$ representing a difference between the phase difference signals from detector 8 at frequencies f1 and f2 is calculated. The amplitude of variable gain amplifier 9 is manually adjusted such that variation $\Delta\phi 1$ as the phase difference corresponding to frequency variation $\Delta f1$ is equal to a predetermined phase angle (a frequency vs. phase angle).

(ii) As shown in FIG. 3, the output frequency of variable frequency generator 2 is sequentially changed to measure difference $\Delta\phi 2$ between actual folded phases corresponding to theoretical folded difference values 360° and 0°, that is, a difference between maximum and minimum values of the folded phase differences. The gain of variable gain amplifier 9 is manually adjusted according to the measurement results. According to this method, the reference phase setter in place of object 1 need not be used.

The reference phase setter is used in method (i). The setter is expensive and its phase characteristics are unstable in relation to changes in ambient conditions such as changes in temperatures. For this reason, the calibration ambient conditions must be maintained to be the designated constant conditions. However, this requirement is extremely difficult to satisfy in practice. According to method (ii), the influences of changes in ambient conditions can be neglected. However, method (ii) poses the following problem. In method (ii), the phase measurement apparatus is calibrated by difference $\Delta\phi 2$ between the actual phase differences corresponding to theoretical folded phase difference values 360° and 0°. However, in practice, the phase difference signals from phase detector 8 at the folded phase differences are unstable, and accurate calibration is difficult. More specifically, the actual folded phase differences can be almost the same as the theoretical folded phase difference values 360° and 0°, but cannot coincide therewith in a strict sense. Therefore, even if difference $\phi a$ between the phase differences at given frequencies f3 and f4 is measured, a reference value for difference $\phi a$ is indefinite, and accurate calibration cannot be performed. Therefore, accurate calibration is difficult to perform by the two conventional methods described above.

In addition, the reference phase setter used in method (i) has a narrow frequency band representing the limited frequency characteristics. Therefore, in order to calibrate the phase measurement apparatus in a wide frequency range, several expensive phase setters must be used.

SUMMARY OF THE INVENTION

It is, therefore, an object of the present invention to provide a new and improved phase measurement apparatus with automatic calibration, which is not influenced by changes in ambient conditions and can easily perform automatic calibration with high precision at low cost.

According to the present invention, there is provided a phase measurement apparatus with automatic calibration, comprising:

first and second connection terminals connected to an object to be measured in a phase measurement mode, a calibration member connected in place of the object between the first and second connection terminals in the phase calibration mode, the calibration member being adapted to have at least linear frequency vs. phase characteristics, mode selecting means for selecting the phase measurement mode or a phase calibration mode for the object or the calibration member to be connected between the first and second connection terminals, the mode selecting means being adapted to generate an instruction for a selected mode, frequency setting means for receiving the instruction corresponding to the selected mode and generating variable frequency setting data corresponding to the received instruction, variable frequency signal generating means for receiving the variable frequency setting data corresponding to the received instruction and generating a variable frequency signal corresponding to the received variable frequency setting data, the variable frequency signal generating means being connected to the first connection terminal to supply the variable frequency signal to the object or the calibration member, phase difference detecting means connected to the first and second connection terminals to detect a difference between an input phase and an output phase of the variable frequency signal supplied to the object or the calibration member, variable amplifier means for receiving a phase difference detection signal from the phase difference detecting means and amplitude setting data, and amplifying the detection signal at a variable amplitude determined by the amplitude setting data, display means for receiving the phase difference detection signal amplified by the variable amplifier means and displaying the amplified phase difference detection signal, first and second phase ratio operating means for receiving the instruction for the phase calibration mode from the mode selecting means, and fetching, in response to the phase calibration mode instruction, the phase difference detection signal amplified by the variable amplifier means and the variable frequency setting data from the frequency setting means to perform predetermined operations, the first phase ratio operating means including means for calculating a first frequency vs. phase difference ratio between at least first and second frequencies of the variable frequency setting data, the first and second frequencies being determined such that the phase difference detection signals have a single level, the second phase ratio operating means including means for calculating a second frequency vs. phase difference ratio between at least third and fourth frequencies of the variable frequency setting data, the third and fourth frequencies being determined such that the phase difference detection signals have first and second levels, phase ratio comparing means for comparing outputs from the first and second frequencies vs. phase difference ratio calculating means, and amplitude setting means for receiving comparison results from the phase ratio comparing means and generating and supplying the amplitude setting data to the amplifier means such that the comparison result is substantially zero.

BRIEF DESCRIPTION OF THE DRAWINGS

These and other objects and features of the present invention can be understood by the following embodiment with reference to the accompanying drawings, in which:

FIG. 4 is a schematic diagram of a phase measurement apparatus according to an embodiment of the present invention;

DETAILED DESCRIPTION OF THE PREFERRED EMBODIMENT

Figures 1, 2:
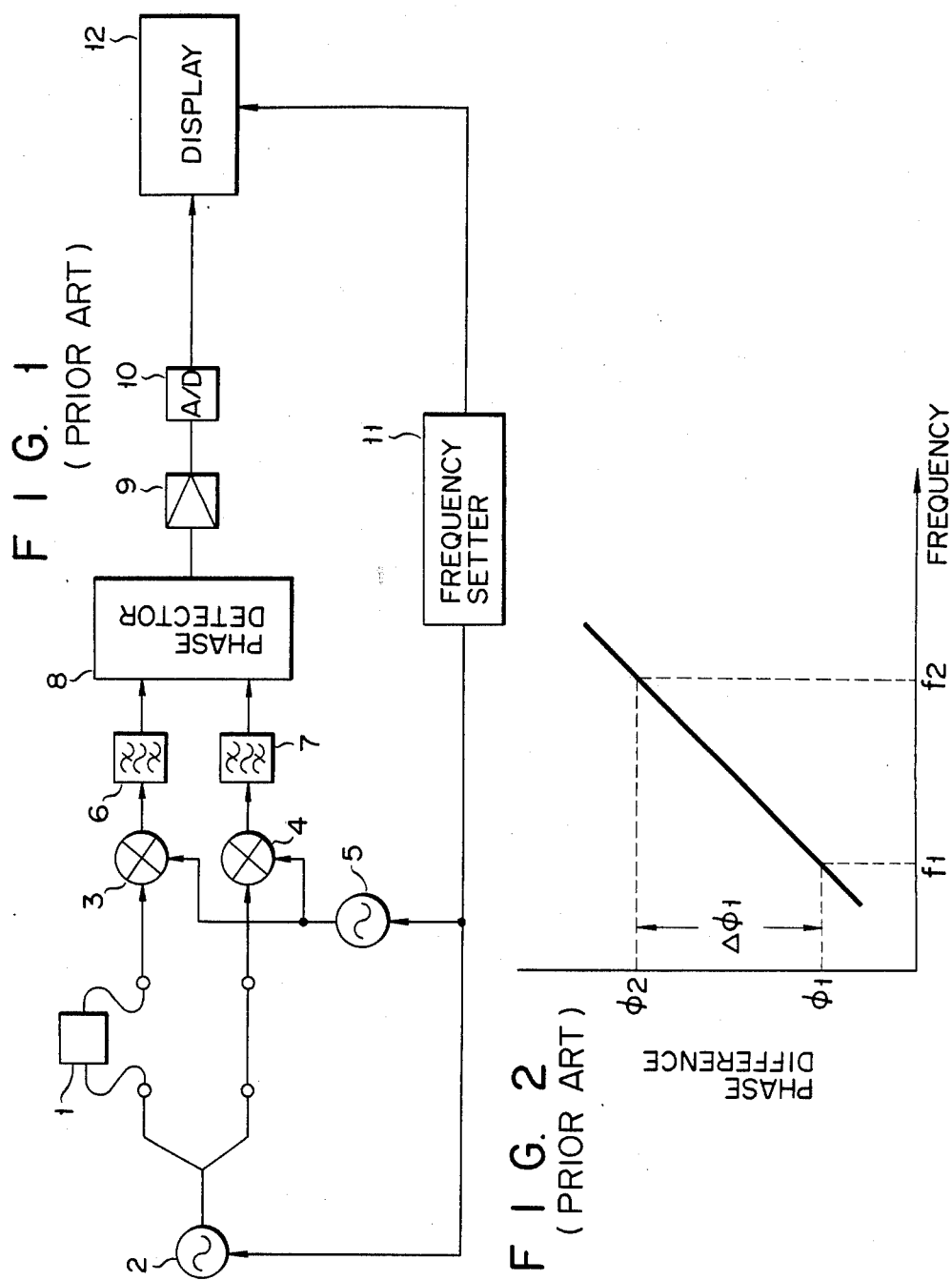
FIG. 1 is a schematic diagram of a conventional phase measurement apparatus.
FIGS. 2 and 3 are graphs for explaining conventional calibration methods used in the apparatus of FIG. 1.
Figure 3:
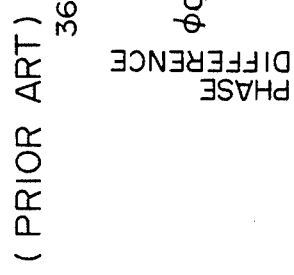

A phase measurement apparatus according to an embodiment of the present invention will be described with reference to the accompanying drawings. Referring to FIG. 4, reference numeral 1 denotes an object to be measured. Object 1 receives an output signal from variable frequency signal generator 2 on the basis of variable frequency setting data from frequency set section 21-4 in operation control circuit 21 (to be described in detail later). A frequency signal passed through object 1 is supplied to mixer 3. The output signal from generator 2 is directly supplied to another mixer 4. Mixers 3 and 4 mix a local frequency signal from local oscillator 5 with the output signals supplied through object 1 and directly from generator 2. Low-frequency signals are output from mixers 3 and 4 and pass through filters 6 and 7, respectively. IF (Intermediate Frequency) signals from filters 6 and 7 are then supplied to phase detector 8. Detector 8 calculates a difference between the IF signals and generates a phase difference signal. The phase difference signal is amplified by variable gain amplifier 9 and converted by A/D (Analog/Digital) converter 10 to a digital signal. The digital signal is supplied to operation control circuit 12. Control circuit 21 receives the digital phase difference signal and displays it on display 21. Therefore, the phase difference caused by object 1, i.e., the phase characteristics of object 1, can be displayed on display 12. The above operation is based on an assumption that mode selection switch 23 is set in a phase measurement mode (MEA.) position.

Figure 5:
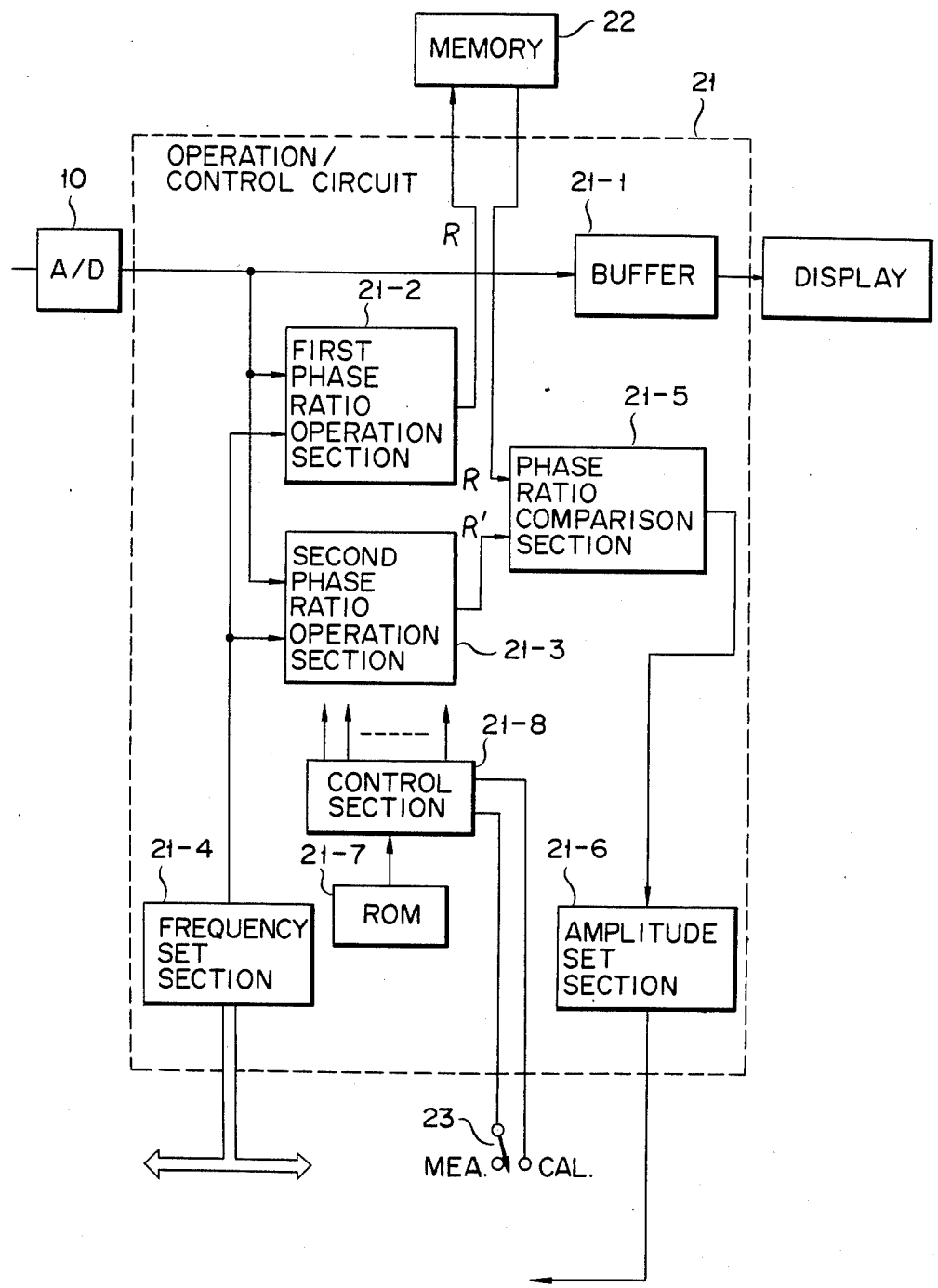
FIG. 5 is a block diagram of an operation control section in FIG. 4.

In addition to buffer 21-1 having the display function described above, operation control circuit 21 also includes first and second phase ratio operation sections 21-2 and 21-3 (to be described in detail later), frequency set section 21-4, phase ratio comparison section 21-5, amplitude set section 21-6, ROM 21-7, and control section 21-8, as shown in FIG. 5. ROM 21-7 stores programs required when mode selection switch 23 is set in a phase calibration mode (CAL.) position, and control section 21-8 controls the operation of the respective components on the basis of these programs in the phase calibration mode. Operation section 21-2 changes output frequencies of generator 2 and oscillator 5 in a relatively wide frequency range through frequency set section 21-4. In this state, operation section 21-2 receives digital phase difference signals at frequencies as integer multiples of phase difference $2\pi$ through phase comparator 8, variable gain amplifier 9, and A/D converter 10 to calculate first frequency vs. phase difference ratio R for calibration member 20 used for calibration (to be described later). Phase difference ratio R is stored in memory 22. Similarly, operation section 21-3 changes output frequencies of generator 2 and oscillator 5 in a relatively narrow frequency range and receives digital phase difference signals at upper and lower limit frequencies within this range to calculate second frequency vs. phase difference ratio R'. Comparison section 21-5 compares ratios R and R'. If ratio R' is smaller than R, amplitude set section 21-6 increases the gain of amplifier 9. Otherwise, the gain of amplifier 9 is decreased.

In the phase measurement apparatus of this embodiment, calibration member 20 having simple linear frequency vs. phase characteristics is used in place of object 1 during calibration. The frequency vs. phase characteristics of calibration member 20 can be unknown.

Figure 6:
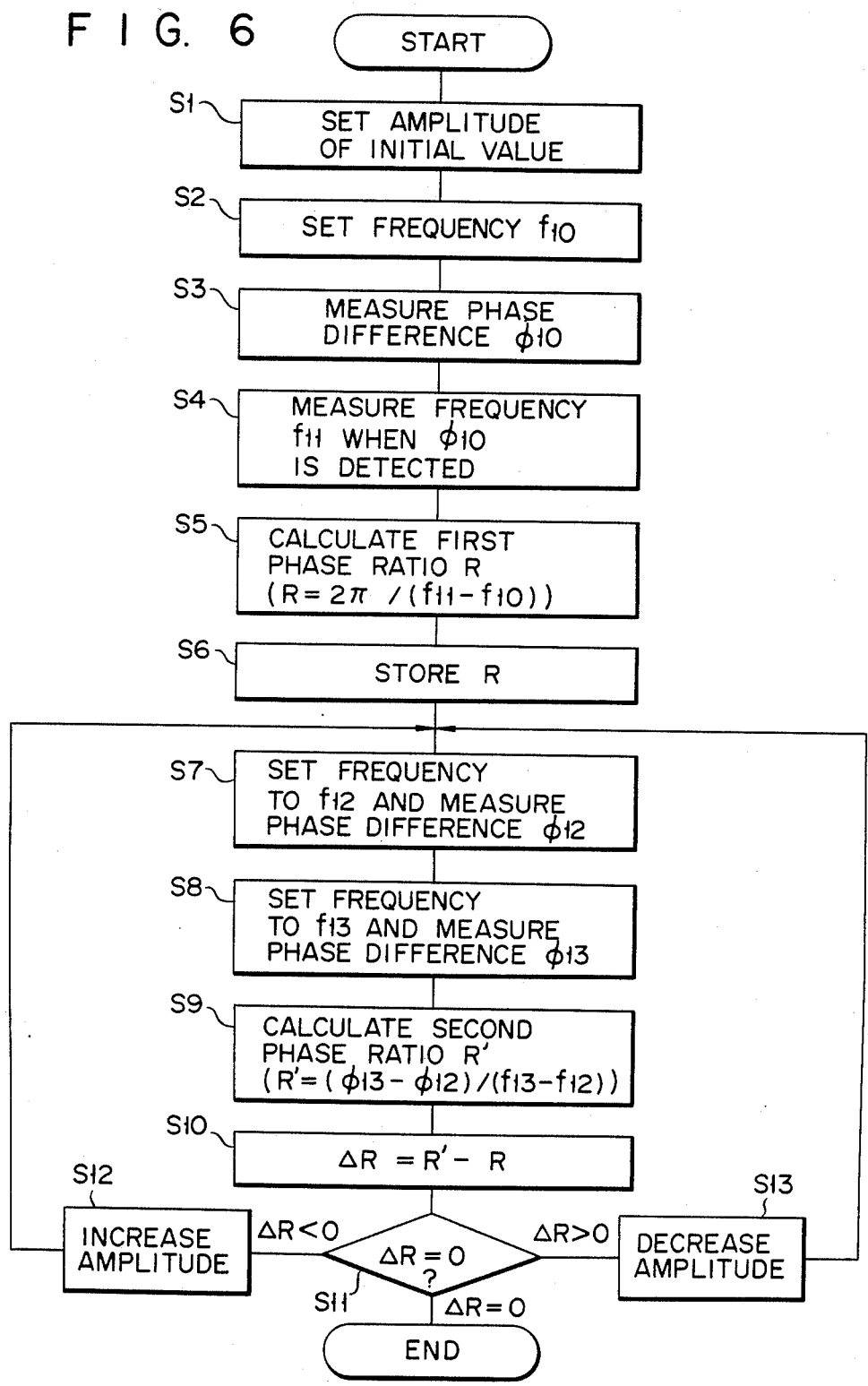
FIGS. 6 to 9 are views for explaining the calibration operation of the apparatus in FIG. 4.
Figure 7:
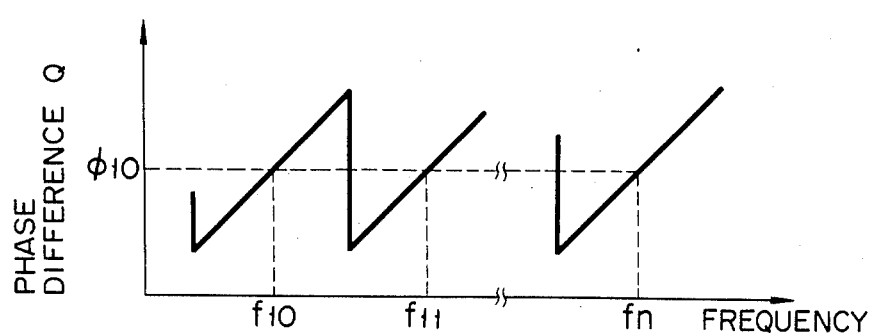

The calibration operation of the phase measurement apparatus having the arrangement described above will be described with reference to the flow chart in FIG. 6. A preset value is set in amplitude set section 21-6 (step S1). An instruction is supplied from frequency set section 21-4 in control circuit 21 to variable frequency signal generator 2 and local oscillator 5. As shown in FIG. 7, generator 2 outputs a signal having frequency f10 (step S2). The output signal is supplied as a first frequency signal to mixer 4 and is also supplied to calibration member 20. An output from calibration member 20 is supplied as a second frequency signal to another mixer 3. Mixers 3 and 4 mix a local frequency signal from oscillator 5 with the first and second frequency signals. Outputs from mixers 3 and 4 are output as low-frequency signals. The low-frequency signals pass through filters 6 and 7, respectively, and the filtered signals are supplied to phase detector 8. Phase detector 8 detects the phases of the filtered signals and outputs phase difference signal Q representing a difference between the first and frequency signals. Signal Q is digitized by A/D converter 10 through variable amplifier 9, and the amplified signal is supplied to control circuit 21. Control circuit 21 causes operation section 21-2 to calculate phase difference $\phi10$ from the input digital phase difference signal. Difference $\phi10$ is stored in memory 22 (step S3). At this time, output frequency f10 is also stored in memory 22. Subsequently, the output frequency of generator 2 is increased until the level of phase difference signal Q from phase detector 8 is equal to that of phase difference signal Q at output frequency f10, i.e., until the frequency is increased to frequency f11 corresponding to a phase difference of 360°. This is because a phase difference between the two frequencies for deriving phase difference signals of an identical level is theoretically 360° ($2\pi$). The reference range of frequencies required for giving a phase shift of 360° for calibration member 20 is thus determined. If the level of signal Q reaches $\phi10$, output frequency f11 of generator 2 is stored in memory 22 (step S4). After the above operations are completed, operation section 21-2 calculates ratio R representing a phase shift per unit frequency change, and ratio R is stored in memory 22 (steps S5 and S6). Ratio R is given as follows:

$$R = 360°/(f11 - f10) \quad (1)$$

Figure 8:
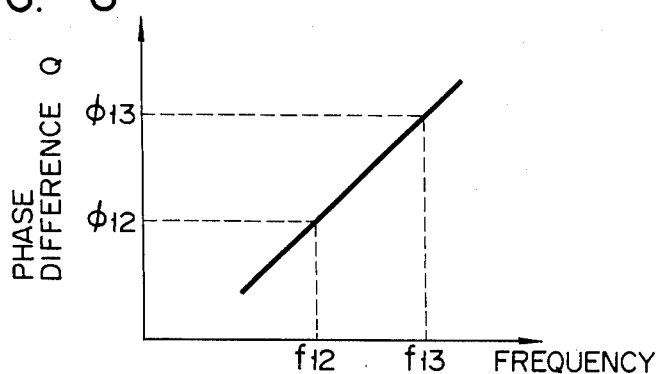
Figure 9:
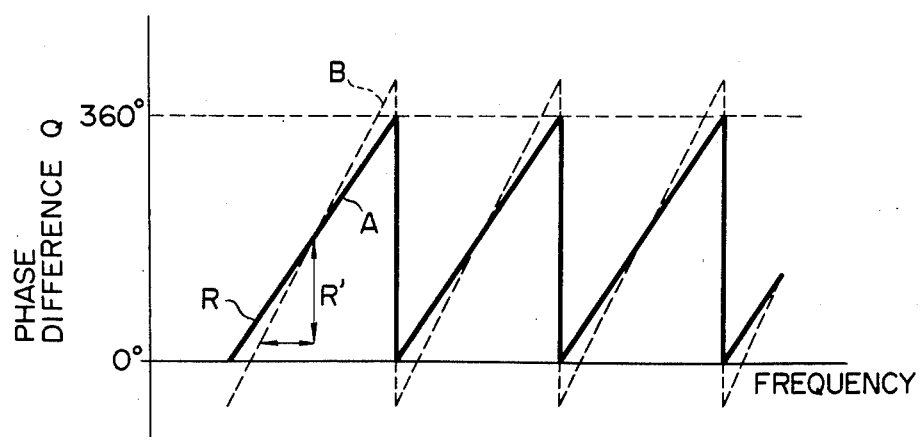

As shown in FIG. 8, any output frequency f12 is set in variable frequency signal generator 2 in the same manner as described above. Digital phase difference $\phi12$ of phase difference signal Q output from phase detector 8 at output frequency f12 is stored in memory 22 (step S7). In this case, the frequency change occurs within a narrower frequency range than $2\pi$ corresponding to the frequency range for phase difference of 360°. If the output frequency is f13, the digital phase difference signal of phase difference signal Q output from phase detector 8 is stored together with frequency f13 in memory 22 (step S8). Thereafter, second phase ratio operation section 21-3 calculates ratio R' (step S9). Ratio R' is given by the following equation:

$$R' = (\phi13 - \phi12)/(f13 - f12) \quad (2)$$

When ratios R and R' are calculated as described above, comparison section 21-5 compares ratios R and R' (steps S10 and S11). If ratio R' is smaller than ratio R, the gain of variable gain amplifier 9 is increased (step S12). Otherwise, the gain is decreased (step S13). If ratio R does not coincide with ratio R', phase difference signal A is defined as one after calibration and phase difference signal B is defined as one before calibration so that ratio R represents a slope of phase difference signal A and ratio R' represents a slope of phase difference signal B. Therefore, the amplitude of amplifier 9 is continuously adjusted. If ratio R coincides with R', the calibration is completed.

In the above embodiment, calibration member 20 simply having good linear frequency vs. phase characteristics is connected to the phase measurement apparatus, and first frequency vs. phase difference ratio R obtained by the two output frequencies for giving a phase difference of 360° is compared with second frequency vs. phase difference ratio R' obtained in the relatively narrow frequency range. If ratio R' is smaller than R, the gain of amplifier 9 for amplifying the phase difference signal is increased. Otherwise, the gain is decreased. If calibration member 20 simply has good linearity, it is not influenced by changes in ambient conditions, such as changes in temperatures, thus providing automatic, accurate calibration. In particular, phase difference signals Q at two frequencies for giving a phase difference of 360° can be accurately obtained. The levels of the phase difference signals for the phase difference can be arbitrarily selected. By using a central level among different levels, more accurate calibration can be easily performed. Unlike in the conventional phase measurement apparatus, an expensive reference phase setter need not be used, resulting in low cost.

The present invention is not limited to the particular embodiment described above. For example, ratio R can be obtained by measuring output frequency fn corresponding to a phase difference of 360°×n by using output frequency f10, as shown in FIG. 7. In this case, ratio R is defined as follows:

$$R = 360° \times n/(fn - f10) \quad (3)$$

The object to be measured can be measured as follows. The calibration member is replaced with the object whose phase characteristics are unknown, and mode selection switch 23 is switched to the phase measurement mode (MEA.) position to measure the phase of the object.

What is claimed is:

1. A phase measurement apparatus with automatic calibration, comprising:
   first and second connection terminals connected to an object to be measured in a phase measurement mode;
   a calibration member connected in place of the object between said first and second connection terminals in the phase calibration mode, said calibration member being adapted to have at least linear frequency vs. phase characteristics;
   mode selecting means for selecting the phase measurement mode or a phase calibration mode for the object or said calibration member to be connected between said first and second connection terminals, said mode selecting means being adapted to generate an instruction for a selected mode;
   frequency setting means for receiving the instruction corresponding to the selected mode and generating variable frequency setting data corresponding to the received instruction;
   variable frequency signal generating means for receiving the variable frequency setting data corresponding to the received instruction and generating a variable frequency signal corresponding to the received variable frequency setting data, said variable frequency signal generating means being connected to said first connection terminal to supply the variable frequency signal to the object or said calibration member;
   phase difference detecting means connected to said first and second connection terminals to detect a difference between an input phase and an output phase of the variable frequency signal supplied to the object or said calibration member;
   variable amplifier means for receiving a phase difference detection signal from said phase difference detecting means and amplitude setting data, and amplifying the detection signal at a variable amplitude determined by the amplitude setting data;

display means for receiving the phase difference detection signal amplified by said variable amplifier means and displaying the amplified phase difference detection signal;

first and second phase ratio operating means for receiving the instruction for the phase calibration mode from said mode selecting means, and fetching, in response to the phase calibration mode instruction, the phase difference detection signal amplified by said variable amplifier means and the variable frequency setting data from said frequency setting means to perform predetermined operations, said first phase ratio operating means including means for calculating a first frequency vs. phase difference ratio between at least first and second frequencies of the variable frequency setting data, the first and second frequencies being determined such that the phase difference detection signals have a single level, said second phase ratio operating means including means for calculating a second frequency vs. phase difference ratio between at least third and fourth frequencies of the variable frequency setting data, the third and fourth frequencies being determined such that the phase difference detection signals have first and second levels;

phase ratio comparing means for comparing outputs from said first and second frequencies vs. phase difference ratio calculating means; and amplitude setting means for receiving comparison results from said phase ratio comparing means and generating and supplying the amplitude setting data to said amplifier means such that the comparison result is substantially zero.

2. An apparatus according to claim 1, wherein the first and second frequencies in the variable frequency setting data have a frequency difference of $2\pi$.

3. An apparatus according to claim 1, wherein the third and fourth frequencies in the variable frequency setting data have a frequency difference smaller than that between the first and second frequencies.

4. An apparatus according to claim 1, wherein the identical level of the phase difference detection signal is a central level.

* * * * *